United States Patent [19]
Kimura

[11] Patent Number: 5,712,594
[45] Date of Patent: Jan. 27, 1998

[54] OPERATIONAL TRANSCONDUCTANCE AMPLIFIER OPERABLE AT LOW SUPPLY VOLTAGE

[75] Inventor: Katsuji Kimura, Tokyo, Japan

[73] Assignee: NEC Corporation, Tokyo, Japan

[21] Appl. No.: 632,126

[22] Filed: Apr. 15, 1996

[30] Foreign Application Priority Data

May 31, 1995 [JP] Japan ................................ 7-158408

[51] Int. Cl.$^6$ ............................................. H03F 3/45
[52] U.S. Cl. ................................. 330/253; 330/261
[58] Field of Search ............................ 330/252, 253, 330/260, 261, 149

[56] References Cited

U.S. PATENT DOCUMENTS

| | | | |
|---|---|---|---|
| 5,371,474 | 12/1994 | Wassenaar et al. | 330/258 X |
| 5,481,224 | 1/1996 | Kimura . | |
| 5,485,119 | 1/1996 | Kimura . | |
| 5,500,623 | 3/1996 | Kimura . | |
| 5,512,855 | 4/1996 | Kimura . | |
| 5,521,542 | 5/1996 | Kimura . | |
| 5,561,392 | 10/1996 | Kimura . | |
| 5,578,965 | 11/1996 | Kimura . | |
| 5,581,211 | 12/1996 | Kimura . | |

FOREIGN PATENT DOCUMENTS 6-303056  10/1994  Japan .

OTHER PUBLICATIONS

K. Kimura, "Some Circuit Design Techniques ... Rectifiers Operable on Low Supply Voltage", *IEEE Trans. on Cir. and Sys. —I: Fund. Theory and Applns*, vol. 39, No. 9, Sep. 1992, pp. 771–777.

*Primary Examiner*—James B. Mullins
*Attorney, Agent, or Firm*—Sughrue,Mion,Zinn,Macpeak & Seas, PLLC

[57] ABSTRACT

An OTA capable of low-voltage operation at a voltage as low as approximately 1 V while restraining the circuit scale increase and keeping approximately the same input voltage range as that of the conventional one. This OTA has a differential pair of first and second bipolar or MOS transistors driven by a first constant current source, and a squarer driven by a second constant current source. The differential pair is applied with an input voltage and produces an output current of the OTA. The squarer is applied with the input voltage and produces differentially first and second output currents having a square-law characteristic. The first constant current source supplies a first constant current equal to a second constant current supplied by the second constant current source. The second output current of the squarer is supplied to the first constant current source.

5 Claims, 7 Drawing Sheets

5,712,594

OPERATIONAL TRANSCONDUCTANCE AMPLIFIER OPERABLE AT LOW SUPPLY VOLTAGE

BACKGROUND OF THE INVENTION

1. Field of the Invention

The present invention relates to an operational transconductance amplifier and more particularly, to an operational transconductance amplifier capable of low-voltage operation at a supply voltage as low as approximately 1 V, which enables to realize superior transconductance linearity within a wide input voltage range and which is formed on a semiconductor integrated circuit device.

2. Description of the Prior Art

An adaptively-biased differential amplifier circuit for amplifying an analog signal that enables the superior transconductance linearity within a comparatively wide input voltage range is known as an "operational transconductance amplifier (OTA)". If the operational transconductance amplifier is comprised of bipolar transistors or metal-oxide-semiconductor field-effect transistors (MOSFETs), it is termed a "bipolar OTA" or an "MOS OTA", respectively. The OTA is an essential circuit element for analog signal processing and is useful as a basic building block, because it receives and amplifies an input voltage and produces an output current.

A conventional bipolar OTA was disclosed in the Japanese Non-Examined Patent Publication No. 6-303056 published in October 1994 and in the corresponding U.S. Pat. No. 5,481,224 patented on Jan. 2, 1996, which was invented by the inventor, K, Kimura.

This conventional OTA includes a balanced differential pair formed of first and second bipolar transistors whose emitter areas are equal to each other, and a squarer for driving the differential pair.

Emitters of the first and second transistors are connected in common to one of a pair of output terminals of the squarer. Input ends or basis of the first and second transistors are applied with a first input voltage $V_1$. An output current of the OTA is differentially derived from output ends or collectors of the first and second transistors as the difference between their collector currents.

A pair of input terminals of the squarer is applied with a second input voltage $V_2$. The squarer produces and outputs differentially two output currents $I^+$ and $I^-$ through the pair of output terminals, respectively. The output terminal through which the output currents $I^+$ flows is connected to the emitters of the first and second transistors.

The output current $I^+$ of the squarer increases with the increasing input voltage $V_{IN}$, and the output current $I^-$ thereof decreases with the increasing input voltage $V_{IN}$. The differential pair of the first and second transistors is driven by the output current $I^+$.

The differential pair and the squarer contain first and second resistive dividers, respectively. The first resistive divider is composed of two first resistors connected respectively to the bases of the first and second transistors and a second resistor connected between the bases of the first and second transistors. The first resistors are connected to a pair of input terminals of the OTA, respectively.

Similarly, the second resistive divider is composed of two third resistors connected respectively to the input ends of the squarer and a fourth resistor connected between the input ends thereof. The third resistors are connected to the pair of the input terminals of the OTA, respectively.

An initial input voltage $V_{IN}$ to be amplified is applied to the pair of input terminals of the OTA. The first input voltage $V_1$ is generated by dividing the initial input voltage $V_{IN}$ through the first resistive divider, and is applied across the bases of the first and second transistors of the differential pair. The second input voltage $V_2$ is generated by dividing the initial input voltage $V_{IN}$ through the second resistive divider, and is applied across the input terminals of the squarer.

The above U.S. Pat. No. 5,481,224 disclosed an MOS OTA with the same circuit configuration as above, also.

With the conventional OTA described above, the transconductance non-linearity can be compensated by the output current $I^+$ with a square-law characteristic and consequently, the transconductance linearity can be improved. However, this conventional OTA has a problem that it cannot operate at a supply voltage as low as approximately 1 V within a wide input voltage range while restraining the circuit scale from increasing.

SUMMARY OF THE INVENTION

Accordingly, an object of the present invention is to provide an OTA capable of low-voltage operation at a supply voltage as low as approximately 1 V while restraining the circuit scale increase and keeping approximately the same input voltage range as that of the conventional one.

The above object together with others not specifically mentioned will become clear to those skilled in the art from the following description.

An OTA according to the present invention has (a) a first differential pair of first and second transistors driven by a first constant current source, and (b) a squarer driven by a second constant current source. The first differential pair is applied with an input voltage and produces an output current of the OTA. The squarer is applied with the input voltage and produces differentially first and second output currents having a square-law characteristic.

The first constant current source supplies a first constant current equal to a second constant current supplied by the second constant current source. The second output current of the squarer is supplied to the first constant current source.

With the OTA according to the present invention, the first constant current supplied by the first constant current is equal to the second constant current supplied by the second constant current source, and the second output current of the squarer is supplied to the first constant current source. Therefore, the effective driving current of the first differential pair is equal to the first output current of the squarer. As a result, the transconductance of the differential pair can be linearized.

The squarer can be realized without using any stacked transistor structure and therefore, the OTA can operate at a supply voltage as low as approximately 1 V. On the other hand, since the OTA is composed of the first differential transistor pair and the squarer, the circuit scale does not increase.

Further, since the effective driving current of the first differential pair is equal to the first output current of the squarer, the OTA of the present invention is equivalent to the above conventional OTA where the differential pair is driven by the output current with a square-law characteristic. This means that the linear transconductance can be obtained within approximately the same input voltage range as that of the conventional one.

In a preferred embodiment of the invention, the squarer includes a second unbalanced differential pair of third and fourth transistors whose emitters or sources are coupled together and a third unbalanced differential pair of fifth and sixth transistors whose emitters or sources are coupled together. The collectors or drains of the second and third differential pairs are cross-coupled. The driving capacity of the third transistor is K times as large as that of the fourth transistor, where K>1. The driving capacity of the sixth transistor is K times as large as that of the fifth transistor.

In this specification, the term "driving capacity" means the emitter area for a bipolar transistor and the gate-width to gate-length ratio (W/L) for an MOSFET.

In another preferred embodiment of the invention, the input voltage is divided by resistive dividers and is applied to the squarer.

The above first to sixth transistors may be bipolar transistors or MOSFETs, respectively.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
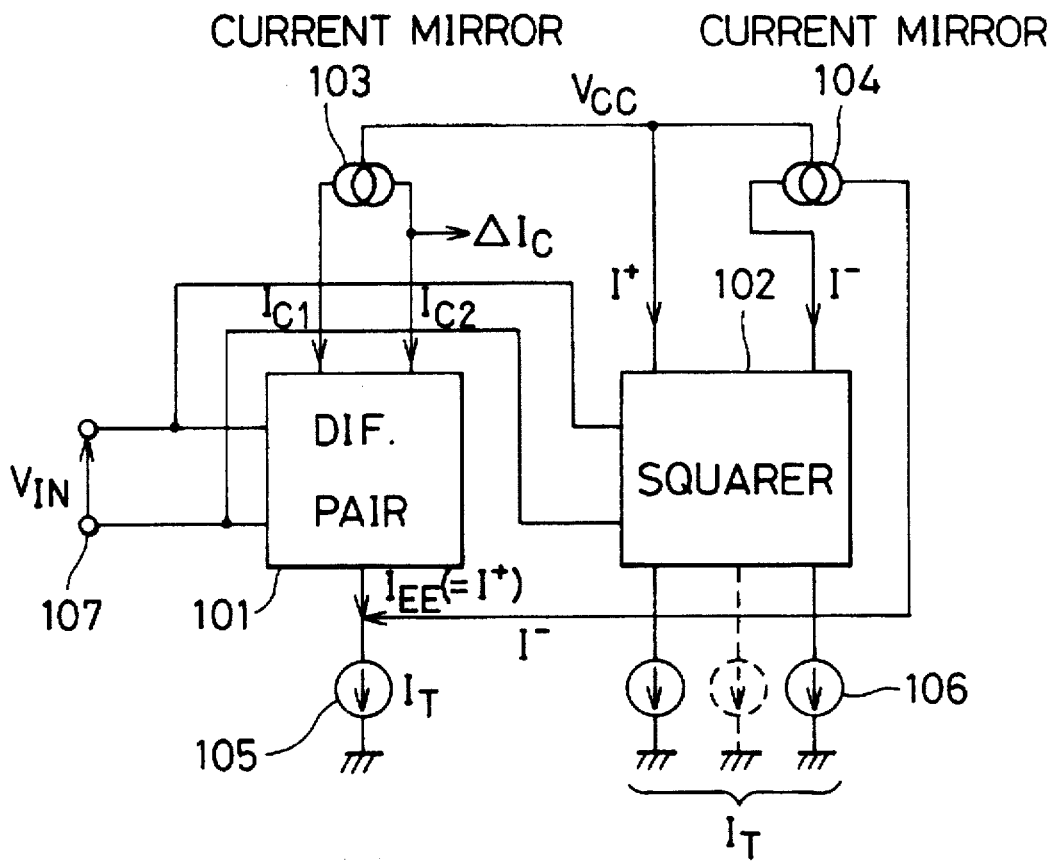
FIG. 1 is a block diagram of a bipolar OTA according to a first embodiment of the present invention.

Preferred embodiments of the present invention will be described below referring to the drawing figures attached.

First Embodiment

Figure 2:
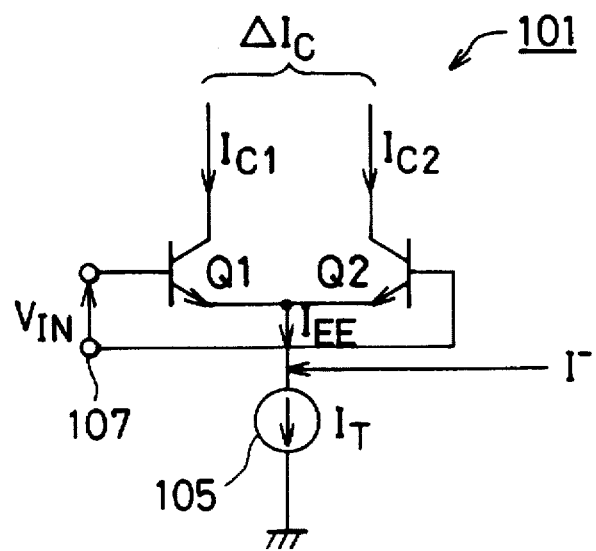
FIG. 2 is a circuit diagram of a bipolar differential pair used for the bipolar OTA according to the first embodiment.

As shown in FIGS. 1 and 2, a bipolar OTA according to a first embodiment contains a differential transistor pair 101, a squarer 102, a current mirror subcircuit 103 serving as an active load of the pair 101, a current mirror subcircuit 104 for adaptably biasing the pair 101, a constant current source 105 for driving the pair 101, and constant current sources 106 for driving the squarer 102.

As shown in FIG. 2, the differential pair 101 is composed of npn-type bipolar transistors Q1 and Q2 whose emitters are coupled together to be connected to one end of the current source 105. The other end of the current source 105 is grounded.

A constant current supplied by the current source 105 is $I_T$. The sum of constant currents supplied by the current sources 106 is equal to $I_T$. In other words, the squarer 102 is driven by the total driving current having the same value $I_T$ as that of the current source 105.

Bases of the transistors Q1 and Q2 are connected to a pair of input terminals 107 of the OTA. An initial input voltage $V_{IN}$ to be amplified is differentially applied across the pair of input terminals 107.

Collectors of the transistors Q1 and Q2 are connected to the current mirror subcircuit 103 serving as the active load of the pair 101. An output current $\Delta I_C$ of the OTA is differentially derived from the collector of the transistor Q2. Therefore, the output current $\Delta I_C$ is expressed as $$\Delta I_C = I_{C1} - I_{C2}$$

where $I_{C1}$ and $I_{C2}$ are collector currents of the respective transistors Q1 and Q2.

Additionally, the sum of the collector currents $I_{C1}$ and $I_{C2}$, which is an effective driving current of the differential pair, is defined as $I_{EE}$, i.e., $$I_{C1} + I_{C2} = I_{EE}$$

is established.

The initial input voltage $V_{IN}$ is differentially applied across a pair of input ends of the squarer 102, also. The squarer 102 produces differentially two output currents $I^+$ and $I^-$ in response to the input voltage $V_{IN}$ and outputs them through its pair of output ends, respectively. The output current $I^+$ increases with the increasing input voltage $V_{IN}$, and the output current $I^-$ thereof decreases with the increasing input voltage $V_{IN}$.

As shown in FIG. 1, the output current $I^-$ is supplied to the current source 105 through the current mirror subcircuit 104.

Here, the squarer 102 is driven by the constant current sources 106. However, it is needless to say that the squarer 102 may be driven a single constant current source.

Next, the operation of the bipolar OTA according to the first embodiment is described below.

The transconductance of the differential pair 101 formed by the transistors Q1 and Q2 can be obtained as follows:

Supposing that the transistors Q1 and Q2 are matched in characteristics and the basewidth modulation can be ignored, the differential output current $\Delta I_C$ of the differential pair 101 or this OTA can be expressed as the following equation (1).

$$\Delta I_C = I_{C1} - I_{C2} = I_{EE} \tanh\left(\frac{V_{IN}}{2V_T}\right) \tag{1}$$

In the equation (1), $\alpha_F$ is the dc common-base current gain factor, and $V_T$ is the thermal voltage expressed as $V_T = (kT/q)$ where k is Boltzmann's constant, T is absolute temperature in degrees Kelvin and q is the charge of an electron.

Since it is popular that the value of the dc common-base current gain factor $\alpha_F$ becomes 0.98 to 0.99, the value of $\alpha_F$ is set here as 1 for the sake of simplification.

If the term $(V_{IN}/V_T)$ in the equation (1) is replaced with x, i.e., $x=(V_{IN}/V_T)$, the term "tanh(x/2)" can be expanded as the following equation (2) when the amplitude of the input voltage $V_{IN}$ is small:

$$\tanh\left(\frac{x}{2}\right) = \frac{1}{2}x - \frac{1}{24}x^3 + \frac{1}{240}x^5 - \frac{17}{40320}x^7 + \ldots \quad (|x| < \pi) \tag{2}$$

$$= \frac{1}{2}x\left(1 - \frac{1}{12}x^2 + \frac{1}{120}x^4 - \frac{17}{20160}x^6 + \ldots\right) \quad (|x| < \pi)$$

From the equation (2), it is seen that the term of "tanh (x/2)" includes a linear term of (½)x and a non-linear term of $[1-(\frac{1}{12})x^2+(\frac{1}{120})x^4-(\frac{17}{20160})x^6+\ldots]$. Therefore, if the effective driving current $I_{EE}$ is equal to (x/2)·coth(x/2), that is, $I_{EE}$=(x/2)·coth(x/2), the transconductance of the bipolar OTA according to the first embodiment becomes linear.

The transconductance of the OTA is obtained by differentiating the equation (1) by $V_{IN}$, which includes the term "(x/2)·coth(x/2)".

The term "coth (x/2)" can be expanded as the following equation (3):

$$\coth\left(\frac{x}{2}\right) = \frac{2}{x} + \frac{1}{6}x - \frac{1}{360}x^3 + \frac{1}{15120}x^5 - \ldots \quad (|x| < 2\pi) \tag{3}$$

Accordingly, the following equation (4) is established as $$\frac{x}{2} \cdot \coth\left(\frac{x}{2}\right) = 1 + \frac{1}{12}x^2 - \frac{1}{720}x^4 + \frac{1}{30240}x^6 - \ldots \quad (|x| < 2\pi) \tag{4}$$

From the equation (4), it is seen that the effective driving current $I_{EE}$ needs to have a square-law characteristic to obtain the linearized transconductance. In this case, the coefficient of the square term $x^2$ in the equation (4) needs to be suitably adjusted by dividing the initial input voltage $V_{IN}$ using resistive dividers or the like.

Thus, the transconductance linearity of the bipolar differential pair 101 can be improved by giving the square-law characteristic to the current $I_{EE}$.

The transconductance curve of the bipolar OTA becomes maximally flat at $V_{IN}=0$ if the following equation (5) is established under the following condition as shown in the equation (6) listed below.

$$\left.\frac{d^3(\Delta I_C)}{dV_{IN}^3}\right|_{V_{IN}=0} = \left.\frac{d^5(\Delta I_C)}{dV_{IN}^5}\right|_{V_{IN}=0} = \ldots = 0 \tag{5}$$

$$\left.\frac{d^2(\Delta I_C)}{dV_{IN}^2}\right|_{V_{IN}=0} \geq \frac{d^2(\Delta I_C)}{dV_{IN}^2} \tag{6}$$

As already disclosed in the above U.S. Pat. No. 5,481,224, if the differential pair 101 is driven by the output current I⁺ that increases with the increasing input voltage $V_{IN}$, the transconductance characteristics of this bipolar OTA can be flat.

Since the squarer 102 is driven by the total driving current $I_T$ and produces differentially the output currents I⁺ and I⁻, the following equation (7) is established:

$$I^+ + I^- = I_T \tag{7}$$

The constant current supplied by the current source 105 is equal to $I_T$, and the output current I⁻ of the squarer 102 is additionally supplied to the current source 105. The output current I⁻ decreases with the increasing input voltage $V_{IN}$. Therefore, the effective driving current $I_{EE}$ of the differential pair 101 is given by the following expression (8);

$$I_{EE} = I_T - I^- \tag{8}$$

As a result, from the equations (7) and (8), the effective driving current $I_{EE}$ is given by the following expression (9) as:

$$I_{EE} = I^+ \tag{9}$$

The equation (9) means that driving the bipolar differential pair 101 by the effective driving current $I_{EE}$ is equivalent to driving the pair 101 by the output current I⁺ having a square-law characteristic. Consequently, the transconductance of the differential pair 101 can be linearized in the same manner as disclosed in the above U.S. Pat. No. 5,481,224.

Figure 3:
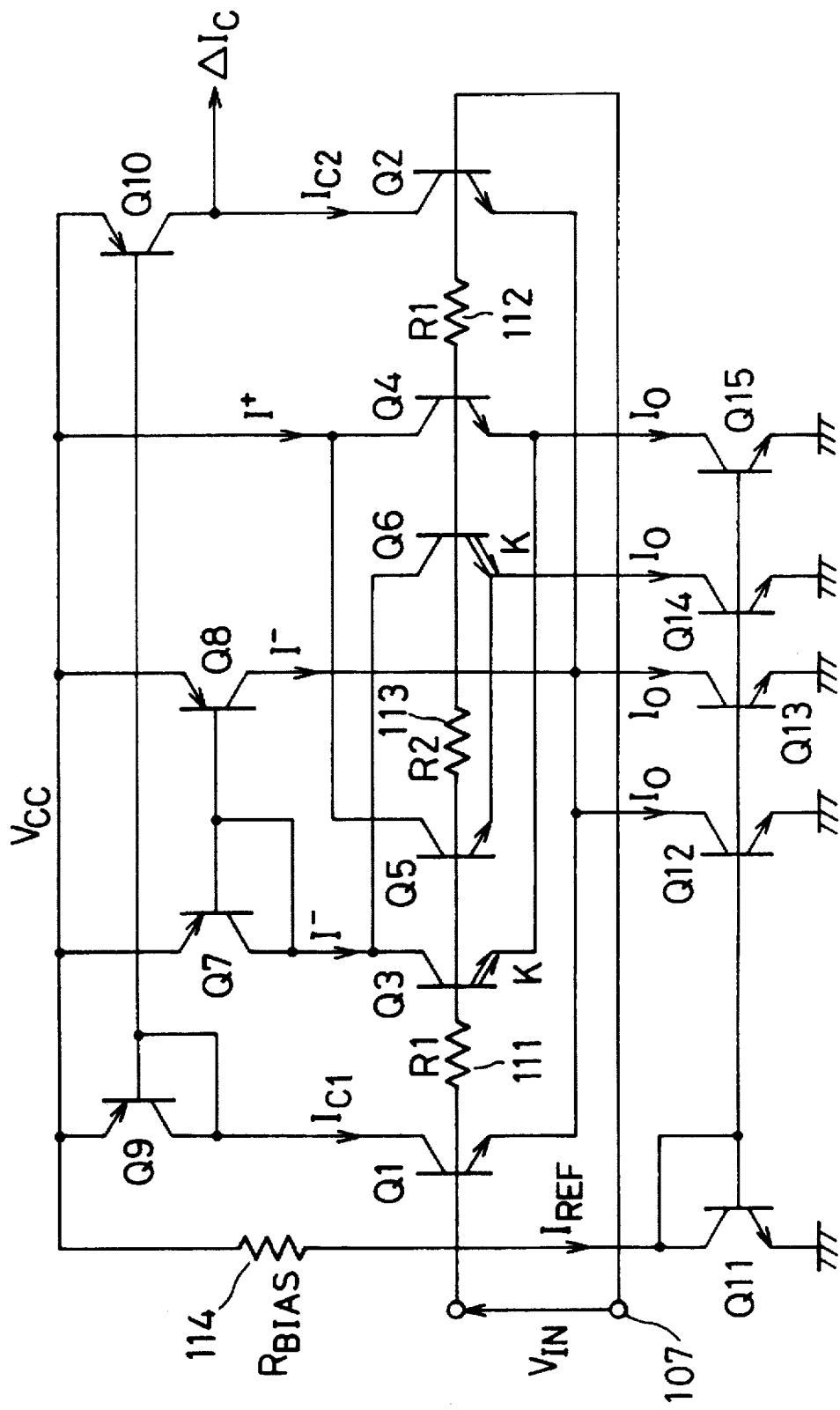
FIG. 3 is a circuit diagram of the bipolar OTA according to the first embodiment.

FIG. 3 shows the entire circuit diagram of the bipolar OTA according to the first embodiment as shown in FIGS. 1 and 2, in which the reference character $V_{cc}$ denotes a supply voltage.

In FIG. 3, the squarer 102 is composed of an unbalanced differential pair of npn-type bipolar transistors Q3 and Q4 whose emitters are coupled together and another unbalanced differential pair of npn-type bipolar transistors Q5 and Q6 whose emitters are coupled together. The transistor Q3 has an emitter area K times as large as that of the transistor Q4, where K is a constant greater than unity, i.e., K>1. The transistor Q6 has an emitter area K times as large as that of the transistor Q5. In other words, the transistor Q3 has the driving capability K times as that of the transistor Q4, and the transistor Q6 has the driving capability K times as that of the transistor Q5.

Five npn-type bipolar transistors Q11, Q12, Q13, Q14 and Q15 whose bases are coupled together form a current mirror subcirucit. The three transistors Q11, Q12 and Q13 serve as the constant current source 105 for driving the differential pair 101 of the transistors Q1 and Q2. The coupled emitters of the transistors Q1 and Q2 are connected to collectors of the transistors Q12 and Q13.

A reference current $I_{REF}$ is supplied to the diode-connected transistor Q11 through a resistor 114 (resistance: $R_{BIAS}$). Constant currents $I_0$ as mirror currents of the reference current $I_{REF}$ flow through the transistors Q12 and Q13, respectively.

The two transistors Q11 and Q15 serve as one of the constant current sources 106 for driving the unbalanced differential pair of the transistors Q3 and Q4. The coupled emitters of the transistors Q3 and Q4 are connected to a collector of the transistor Q15. A constant driving current $I_0$ flows through the transistor Q15 as a mirror current of the reference current $I_{REF}$.

The two transistors Q11 and Q14 serve as one of the constant current sources 106 for driving the unbalanced differential pair of the transistors Q5 and Q6. The coupled emitters of the transistors Q5 and Q6 are connected to a collector of the transistor Q14. A constant driving current $I_0$ flows through the transistor Q14 as a mirror current of the reference current $I_{REF}$.

Thus, since the unbalanced differential pair of the transistors Q3 and Q4 and that of the transistors Q5 and Q6 are driven by the same driving current $I_0$, the total current $I_T$ of the current sources 106 for driving the squarer 102 is equal to $2I_0$, i.e., $I_T=2I_0$.

Two pnp-type bipolar transistors Q9 and Q10 whose bases are coupled together form the current mirror subcircuit 103 serving as the active load of the differential pair 101 of the transistors Q1 and Q2. A collector of the transistor Q1 is connected to the collector of the diode-connected transistor Q9. A collector of the transistor Q2 is connected to a collector of the transistor Q10. The differential output current $\Delta I_C$ of this bipolar OTA is derived from the coupled collectors of the transistors Q2 and Q10.

Two pnp-type bipolar transistors Q7 and Q8 whose bases are coupled together form the current mirror subcircuit 104 supplying the output current $I^-$ of the squarer 102 to the current source 105 for driving the differential pair 101 of the transistors Q1 and Q2. The base and collector of the diode-connected transistor Q7 is connected to a collector of the transistor Q3. A collector of the transistor Q8 is connected to a collector of the transistor Q13 and the coupled emitters of the transistors Q1 and Q2. Thus, the output current $I^-$ of the squarer 102 is supplied to the current mirror circuit made of the transistors Q11, Q12 and Q13.

Since the transistors Q11, Q12, Q13, Q14 and Q15 have the same emitter area and the bases connected in common, all of the mirror currents flowing through the respective transistors Q12, Q13, Q14 and Q15 are $I_0$, which is equal to the reference current $I_{REF}$, i.e., $I_0=I_{REF}$.

A resistor 111 with a resistance R1 is connected between the bases of the transistors Q1 and Q3, and a resistor 112 with the same resistance R1 is connected between the bases of the transistors Q2 and Q4. A resistor 113 with a resistance R2 is connected between the bases of the transistors Q5 and Q6. Thus, the bases of the transistors Q1 and Q2 are differentially applied with the initial input voltage $V_{IN}$.

Also, the input ends of the squarer 102, i.e., the bases of the transistors Q3 and Q5 and the bases of the transistors Q4 and Q6 are differentially applied with the voltage $(V_{IN}/d_2)$, where $d_2$ is defined as (R2/R1).

Accordingly, referring to the equation (9), the effective driving current $I_{EE}$ can be expressed as the following equation (10):

$$I_{EE} = I^+ = 2I_0 - I^- = 2I_0 \left\{ \frac{\cosh\left(\frac{V_{IN}}{d_1 V_T}\right) + \frac{1}{K}}{2\cosh\left(\frac{V_{IN}}{d_2 V_T}\right) + K + \frac{1}{K}} \right\} \quad (10)$$

Details of the introduction process for the equation (10) was disclosed in an article written by the inventor, K. Kimura, IEEE Trans. Circuits and Systems-I, Vol. 39, No. 9, pp771–777, September, 1992, entitled "Some Circuit Design Techniques for Bipolar and MOS Pseudologarithmic Rectifiers Operable on Low Supply Voltage".

Because the differential pair 101 of the transistors Q1 and Q2 is driven by the constant current $I_{EE}$, the differential output current $\Delta I_C$ of this OTA can be expressed as the following equation (11) by substituting the equation (10) into the equation (1):

$$\Delta I_C = 2I_0 \left\{ \frac{\cosh\left(\frac{V_{IN}}{d_2 V_T}\right) + \frac{1}{K}}{2\cosh\left(\frac{V_{IN}}{d_2 V_T}\right) + K + \frac{1}{K}} \right\} \tanh\left(\frac{V_{IN}}{2V_T}\right) \quad (11)$$

The transconductance $g_m$ of the OTA is obtained by differentiating the equation (11) by $V_{IN}$ as the following equation (12):

$$g_m = \frac{d(\Delta I_C)}{dV_{IN}} = \quad (12)$$

$$\frac{I_0}{V_T} \left[ \frac{\cosh\left(\frac{V_{IN}}{d_2 V_T}\right) + \frac{1}{K}}{\cosh^2\left(\frac{V_{IN}}{2V_T}\right)\left\{2\cosh\left(\frac{V_{IN}}{d_2 V_T}\right) + K + \frac{1}{K}\right\}} + \frac{2}{d_2} \times \frac{\left(K - \frac{1}{K}\right)\tanh\left(\frac{V_{IN}}{2V_T}\right)\sinh\left(\frac{V_{IN}}{d_2 V_T}\right)}{\left\{2\cosh\left(\frac{V_{IN}}{d_2 V_T}\right) + K + \frac{1}{K}\right\}^2} \right]$$

The condition where the curve of the transconductance $g_m$ is maximally flat at $V_{IN}=0$ is obtained from the relationship of $d^3(\Delta_c)/dV_{IN}^3|_{V_{IN}=0}=0$ as the following expression (13):

$$d_2 = \frac{\sqrt{2K(3K-2)}}{(K+1)} \quad (K>1) \quad (13)$$

Figure 4:
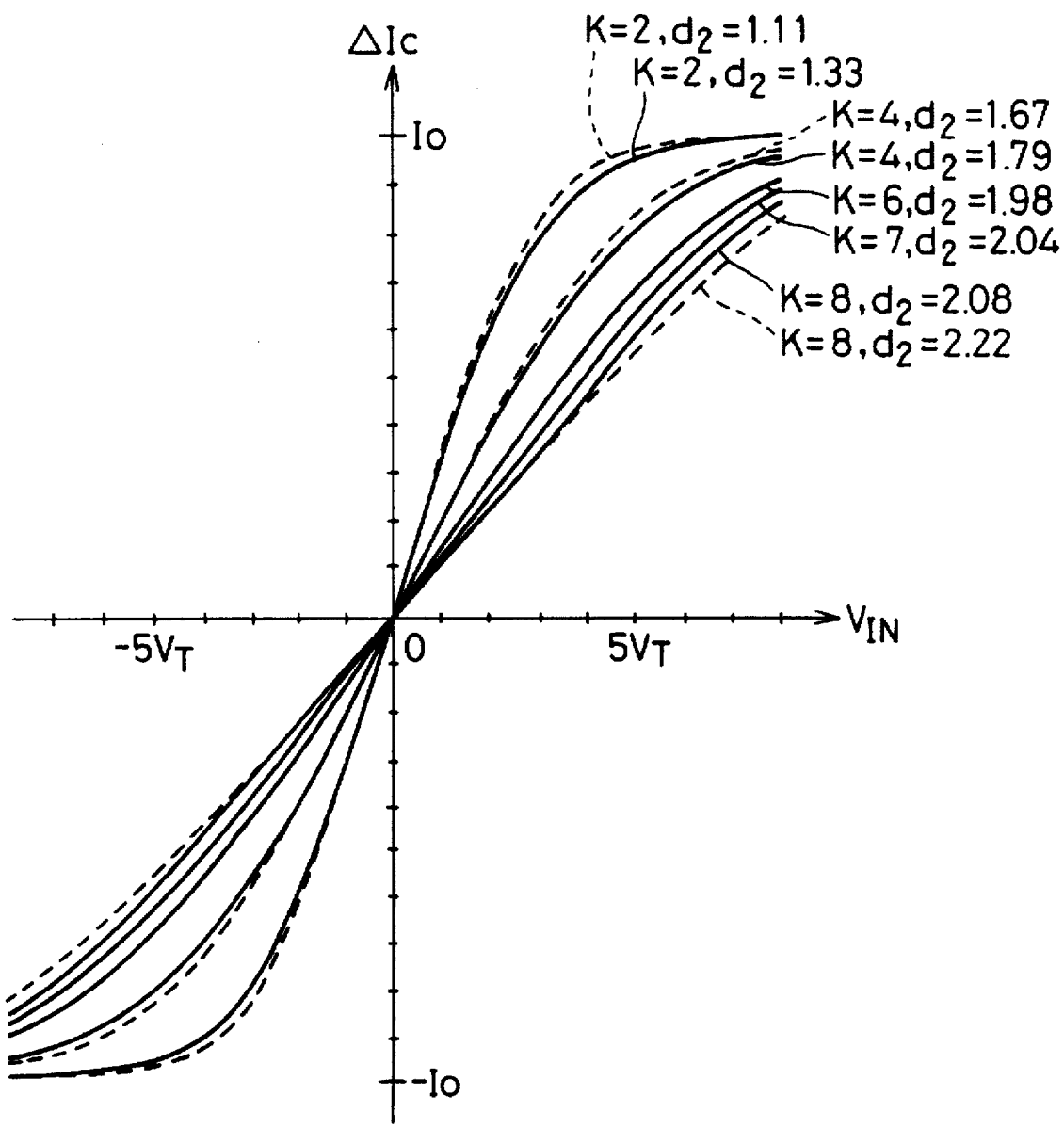
FIG. 4 is a graph showing the transfer characteristics of the bipolar OTA according to the first embodiment.

The transfer characteristic of the OTA according to the first embodiment obtained by the equation (11) is shown in FIG. 4, in which the emitter area ratio K is used as a parameter.

Figure 5:
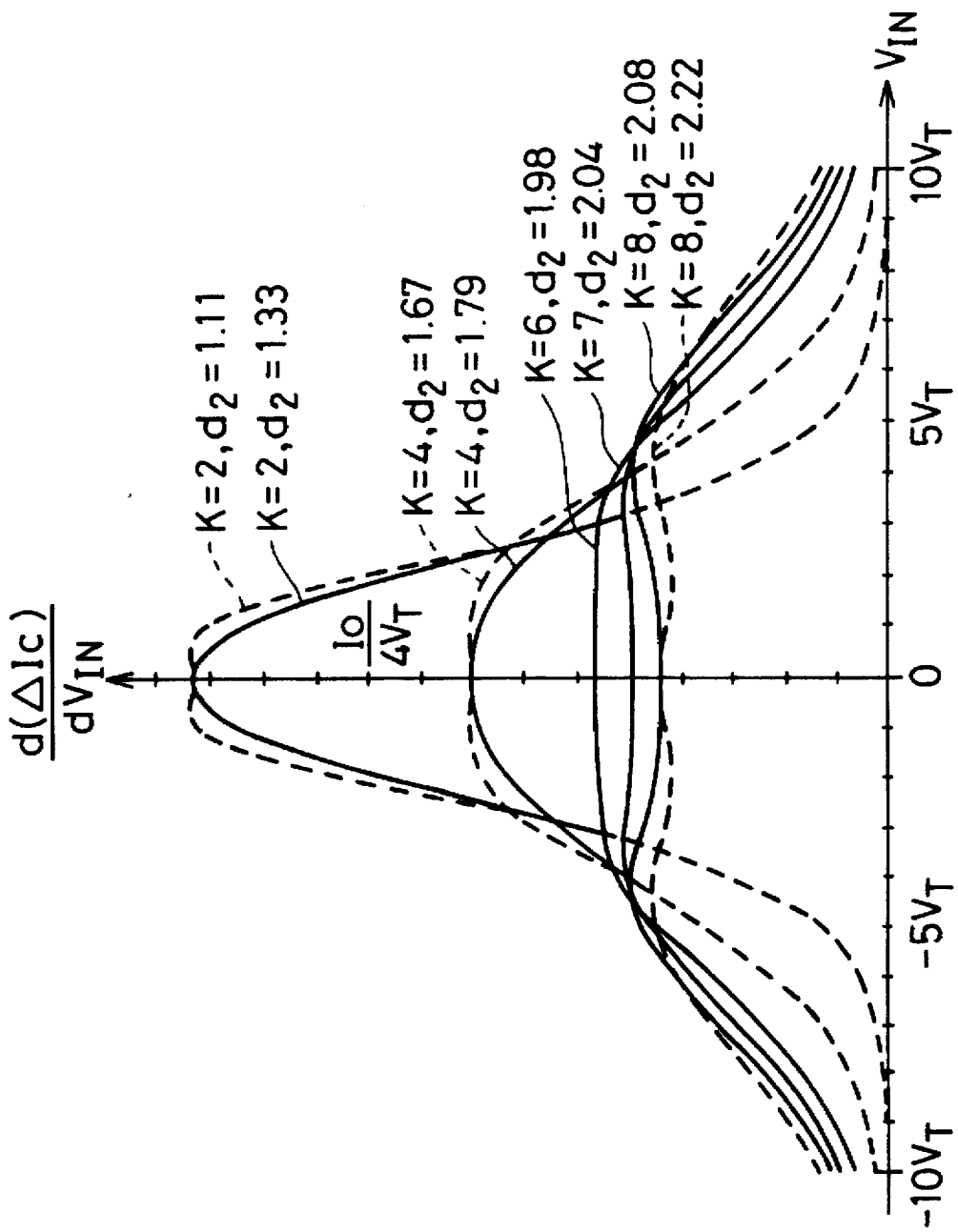
FIG. 5 is a graph showing the transconductance characteristics of the bipolar OTA according to the first embodiment.

The transconductance characteristic of the OTA according to the first embodiment obtained by the equation (12) is shown in FIG. 5, in which the emitter area ratio K is used as a parameter. It is seen from FIG. 5 that the maximum value of the emitter area ratio K satisfying the above equation (6) is 6.

With the OTA according to the first embodiment, the constant current source 105 supplies the constant current $I_T$ equal to the total constant current supplied by the constant current sources 106 for the squarer 102, and the output current $I^-$ of the squarer 102 is supplied to the constant current source 105. Therefore, the effective driving current $I_{EE}$ of the differential pair 101 becomes equal to the output current $I^+$ of the squarer. As a result, the transconductance of the differential pair or this OTA can be linearized.

The squarer 102 uses no stacked transistor structure and therefore, this OTA can operate at a supply voltage as low as approximately 1 V. On the other hand, since the OTA is composed of the differential transistor pair 101 and the squarer 102, the circuit scale does not increase, Further, since the effective driving current $I_{EE}$ of the differential pair 101 is equal to the output current $I^+$ of the squarer 102, this OTA is equivalent to the above conventional OTA where the differential pair is driven by the output current with a square-law characteristic. This means that the linear transconductance can be obtained within approximately the same input voltage range as that of the conventional one.

Figure 6:
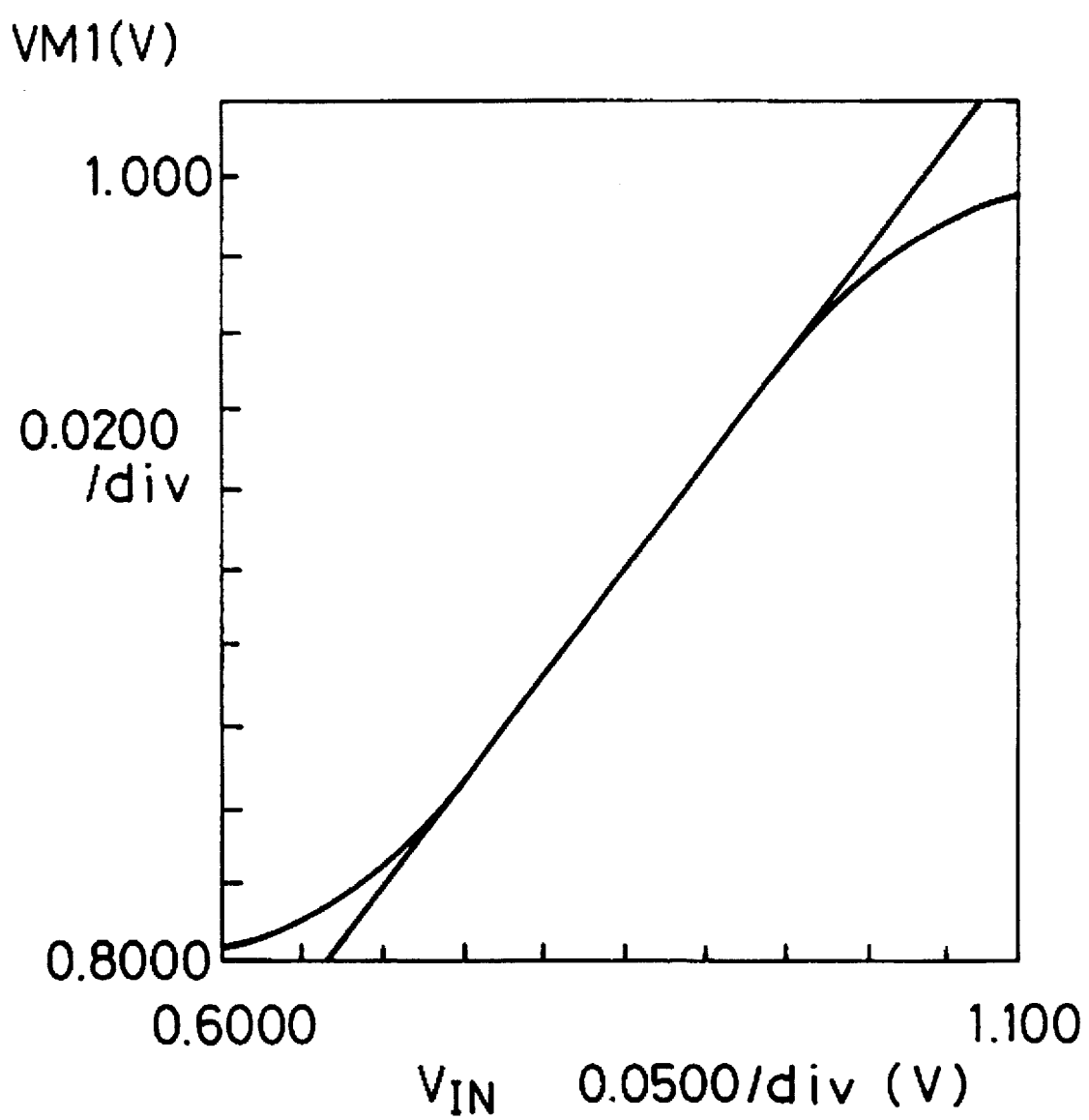
FIG. 6 is a graph showing the measured transfer characteristics of the bipolar OTA according to the first embodiment.

FIG. 6 shows the measured transfer characteristic of this OTA by the inventor, K. Kimura, in which the abscissa is the input voltage $V_{IN}$ (V), the ordinate is the differential output voltage VM1 (V), K=6, and $d_2$=1.9 (R1=27 $\Omega$, R2=55 $\Omega$). As seen from FIG. 6, this OTA operates at a supply voltage of 1 V or higher and the obtainable input voltage range is 200 $mV_{P-P}$ or wider.

Second Embodiment

Figure 7:
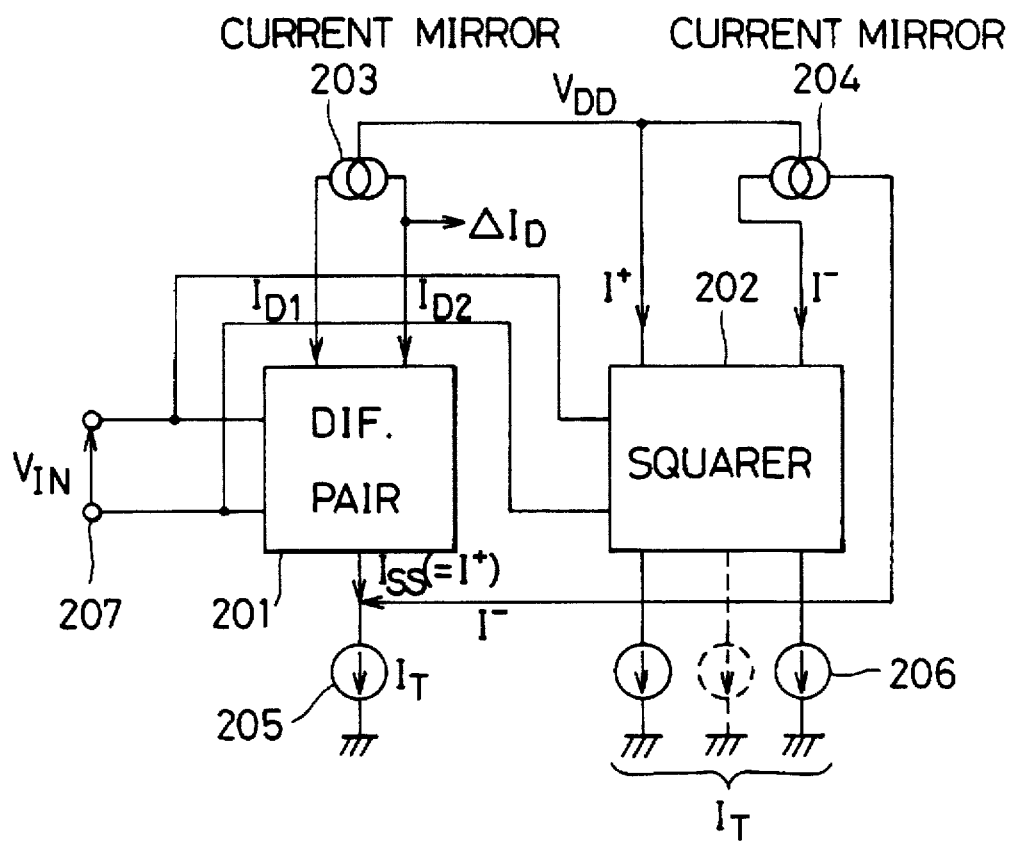
FIG. 7 is a block diagram of an MOS OTA according to a second embodiment of the present invention.
Figure 8:
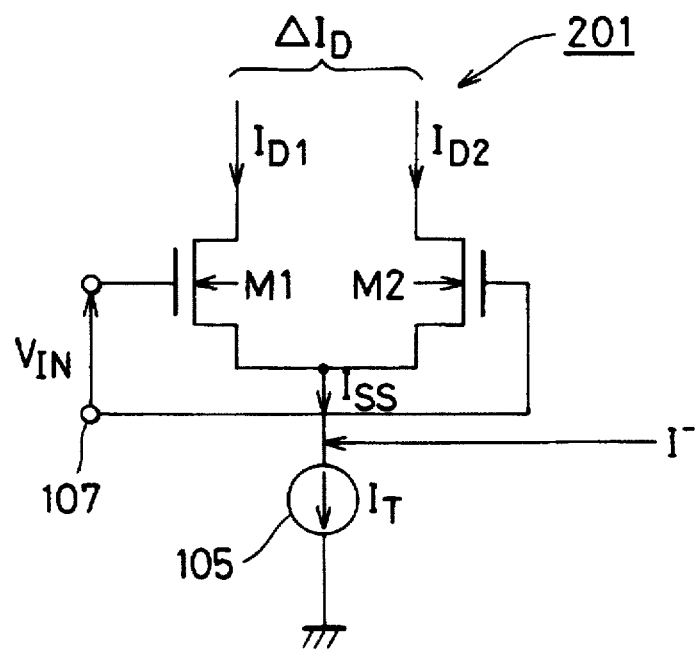
FIG. 8 is a circuit diagram of an MOS differential pair used for the MOS OTA according to the second embodiment.

FIGS. 7 and 8 show an MOS OTA according to a second embodiment of the invention, which is obtained by replacing the bipolar transistors in the first embodiment with MOSFETS, respectively.

This MOS OTA contains a differential transistor pair 201, a squarer 202, a current mirror subcircuit 203 serving as an active load of the pair 201, a current mirror subcircuit 204 for adaptably biasing the pair 201, a constant current source 205 for driving the pair 201, and constant current sources 206 for driving the squarer 202.

The differential pair 201 is composed of n-channel MOSFETs M1 and M2 whose sources are coupled together to be connected to one end of the current source 205. The other end of the current source 205 is grounded.

A constant current supplied by the current source 205 is $I_T$. The sum of Constant currents supplied by the current sources 206 is equal to $I_T$. In other words, the squarer 202 is driven by the total driving current having the same value $I_T$ as that of the Current source 205.

Gates of the MOSFETs M1 and M2 are connected to a pair of input terminals 207 of the OTA. An initial input voltage $V_{IN}$ to be amplified is differentially applied across the pair of input terminals 207.

Drains of the MOSFETs M1 and M2 are connected to the current mirror subcircuit 203 serving as the active load of the pair 201. An output current $\Delta I_D$ of the OTA is differentially derived from the drain of the MOSFET M2. Therefore, the output current $\Delta I_D$ is expressed as $$\Delta I_D = I_{D1} - I_{D2}$$

where $I_{D1}$ and $I_{D2}$ are drain currents of the respective MOSFETs M1 and M2.

Additionally, the sum of the drain currents $I_{D1}$ and $I_{D2}$ is defined as $I_{SS}$, i.e., $$I_{D1} + I_{D2} = I_{SS}$$

is established.

The initial input voltage $V_{IN}$ is differentially applied across a pair of input ends of the squarer 202, also. The squarer 202 produces differentially two output currents $I^+$ and $I^-$ in response to the input voltage $V_{IN}$ and outputs them through its pair of output ends, respectively. The output current $I^+$ increases and the output current $I^-$ decreases with the increasing input voltage $V_{IN}$.

As shown in FIG. 7, the output current $I^-$ is supplied to the current source 205 through the current mirror subcircuit 204.

Here, the squarer 202 is driven by the constant current sources 206. However, it is needless to say that the squarer 202 may be driven a single constant current source.

Next, the operation of the MOS OTA according to the second embodiment is described below.

The transconductance of the differential pair 201 formed by the MOSFETs M1 and M2 can be obtained as follows:

Supposing that the MOSFETs M1 and M2 are matched in characteristics and that the substrate biasing effect and the channel-length modulation can be ignored, the differential output current $\Delta I_D$ (=$I_{D1}-I_{D2}$) of the differential pair 201 or this MOS OTA can be expressed as the following equations (14a) and (14b).

$$\Delta I_D = \beta_1 V_{IN} \sqrt{\frac{2 I_{SS}}{\beta_1} - V_{IN}^2} \quad \left( |V_{IN}| \leq \sqrt{\frac{I_o}{\beta_1}} \right) \quad (14a)$$

$$\Delta I_D = I_{SS} \, sgn(V_{IN}) \quad \left( |V_{IN}| \geq \sqrt{\frac{I_o}{\beta_1}} \right) \quad (14b)$$

In the equations (14a) and (14b), $\beta_1$ is the transconductance parameter of the MOSFETs M1 and M2 which is defined as $\beta_1 = \mu(C_{OX}/2)(W/L)_1$, where $\mu$ is the effective mobility of the carrier, $C_{OX}$ is the gate oxide capacitance per unit area, W is a gate width and L is a gate length. The mark "sgn($V_{IN}$)" in the equation (14b) denotes a signature operator that becomes positive or negative according to the polarlity of the input voltage $V_{IN}$.

Figure 9:
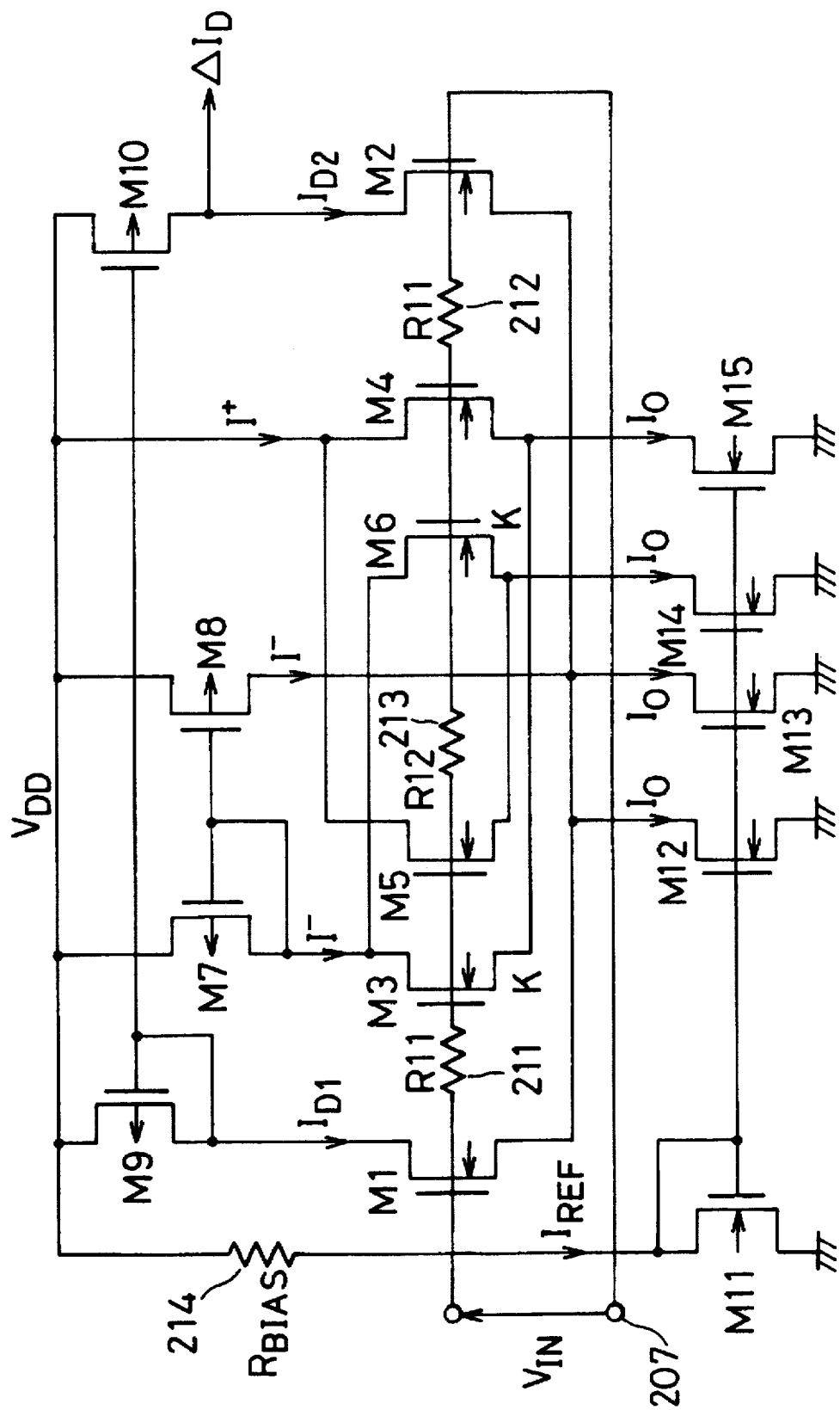
FIG. 9 is a circuit diagram of the MOS OTA according to the second embodiment.

FIG. 9 shows the entire circuit diagram of the MOS OTA according to the second embodiment as shown in FIGS. 7 and 8, in which the reference character $V_{DD}$ denotes a supply voltage.

In FIG. 9, the squarer 202 is composed of an unbalanced differential pair of n-channel MOSFETs M3 and M4 whose sources are coupled together and another unbalanced differential pair of n-channel MOSFETS M5 and M6 whose sources are coupled together. The MOSFET M3 has a gate-width to gate-length ratio (W/L) K times as large as that of the MOSFET M4, where K is a constant greater than unity, i.e., K>1. The MOSFET M6 has a gate-width to gate-length ratio (W/L) K times as large as that of the MOSFET M5. In other words, the MOSFET M3 has the driving capability K times as that of the MOSFET M4, and the MOSFET M6 has the driving capability K times as that of the MOSFET M5.

Five n-channel MOSFETs M11, M12, M13, M14 and M15 whose gates are coupled together form a current mirror subcirucit. The three MOSFETs M11, M12 and M13 serve as the constant current source 205 for driving the differential pair 201 of the MOSFETs M1 and M2. The coupled sources of MOSFETs M1 and M2 are connected to drains of the MOSFETs M12 and M13.

A reference current $I_{REF}$ is supplied to the diode-connected MOSFET M11 through a resistor 214 (resistance: $R_{BIAS}$). Constant currents $I_0$ as mirror currents of the reference current $I_{REF}$ flow through the MOSFETs M12 and M13, respectively.

The two MOSFETs M11 and M15 serve as one of the constant current sources 206 for driving the unbalanced differential pair of the MOSFETs M3 and M4. The coupled sources of the MOSFETs M3 and M4 are connected to a drain of the MOSFET M15. A constant driving current $I_0$ flows through the MOSFET M15 as a mirror current of the reference current $I_{REF}$.

The two MOSFETs M11 and M14 serve as one of the constant current sources 206 for driving the unbalanced differential pair of the MOSFETs M5 and M6. The coupled sources of the MOSFETs M5 and M6 are connected to a drain of the MOSFET M14. A constant driving current $I_0$ flows through the MOSFET M14 as a mirror current of the reference current $I_{REF}$.

Thus, since the unbalanced differential pair of the MOSFETs M3 and M4 and that of the MOSFETs M5 and M6 are driven by the same driving current $I_0$, the total current $I_T$ of the current sources 206 for driving the squarer 202 is equal to $2I_0$, i.e., $I_T=2I_0$.

Two p-channel MOSFETs M9 and M10 whose gates are coupled together form the current mirror subcirucit 203 serving as the active load of the differential pair 201 of the MOSFETs M1 and M2. A drain of the MOSFET M1 is connected to the drain of the diode-connected MOSFET M9. A drain of the MOSFET M2 is connected to a drain of the MOSFET M10. The differential output current $\Delta I_D$ of this MOS OTA is derived from the coupled drains of the MOSFETs M2 and M10.

Two p-channel MOSFETs M7 and M8 whose gates are coupled together form the current mirror subcirucit 204 supplying the output current $I^-$ of the squarer 202 to the constant current source 205 for driving the differential pair 201 of the MOSFETs M1 and M2. The base and collector of the diode-connected MOSFET M7 is connected to a drain of the MOSFET M3. A drain of the MOSFET M8 is connected to a drain of the MOSFET M13 and the coupled sources of the MOSFETs M1 and M2. Thus, the output current $I^-$ of the squarer 202 is supplied to the current mirror circuit of the MOSFETs M11, M12 and M13.

Since the MOSFETs M11, M12, M13, M14 and M15 have the same gate-width to gate-length ratio (W/L) and the gates connected in common, all of the mirror currents flowing through the respective MOSFETs M11, M12, M13, M14 and M15 are $I_0$, which is equal to the reference current $I_{REF}$, i.e., $I_0 = I_{REF}$.

A resistor 211 with a resistance R11 is connected between the gates of the MOSFETs M1 and M3, and a resistor 212 with the same resistance R11 is connected between the gates of the MOSFETs M2 and M4. A resistor 213 with a resistance R12 is connected between the gates of the MOSFETS M5 and M6. Thus, the gates of the MOSFETs M1 and M2 are differentially applied with the initial input voltage $V_{IN}$.

Also, the input ends of the squarer 202, i.e., the gates of the MOSFETs M3 and M5 and the gates of the MOSFETs M4 and M6 are differentially applied with the voltage $(V_{IN}/d_1)$, where $d_1$ is (R12/R11).

The differential pair 201 of the MOSFETs M1 and M2 is driven by the effective driving current $I_{SS}$ and consequently, the differential output current $\Delta I_D$ of this MOS OTA can be expressed as the following equations (15a) and (15b):

$$\Delta I_D = \left(\frac{\beta_1}{d_1^2}\right) V_{IN} \sqrt{\frac{2I_{SS}}{\left(\frac{\beta_1}{d_1^2}\right)} - V_{IN}^2} \quad \left(|V_{IN}| \leq \sqrt{\frac{I_0}{\left(\frac{\beta_1}{d_1^2}\right)}}\right) \tag{15a}$$

$$\Delta I_D = I_{SS} \, sgn(V_{IN}) \quad \left(|V_{IN}| \geq \sqrt{\frac{I_0}{\left(\frac{\beta_1}{d_1^2}\right)}}\right) \tag{15b}$$

The transconductance of the MOS OTA is obtained by differentiating the equations (15a) and (15b) by $V_{IN}$.

From the equations (15a) and (15b), it is seen that the division of the applied voltage by $d_1$ corresponds to the division of the transconductance parameter by $d_1^2$.

As seen from the equation (15a), the differential output current $\Delta I_D$ contains the linear term $(\beta \cdot I_{SS})^{1/2}$ and the non-linear term $[1-V_{IN}^2/\{2I_{SS}/(\beta_1/d_1^2)\}]^{1/2}$. Accordingly, the condition where the transfer curve is a straight line is given at $[1-V_{IN}^2/\{2I_{SS}/(\beta_1/d_1^2)\}]=0$, in other words, the following equation (16) needs to be established:

$$I_{SS} = I_{DC} + \frac{\beta_1}{2d_1^2} \cdot V_{IN}^2 \tag{16}$$

where $I_{DC}$ is a dc component of $I_{SS}$.

Similar to the first embodiment, the two output currents $I^+$ and $I^-$ have the following relationship with the total driving current $I_T$ as $$I^+ + I^- = I_T \tag{17}$$

Since the constant current supplied by the constant current source 205 is equal to $I_T$, the effective driving current $I_{SS}$ of the differential pair 201 is expressed by the following equation (18):

$$I_{SS} = I_T - I^- \tag{18}$$

From the equations (17) and (18), the following equation (19) is established:

$$I_{SS} = I^+ \tag{19}$$

Therefore, also in the MOS OTA according to the second embodiment, the effective driving current $I_{SS}$ of the differential pair 201 is equal to $I^+$, resulting in the linearized transconductance of the MOS OTA.

As described above, although the transconductance of the bipolar OTA is Proportional to the effective driving current $I_{EE}$, the transconductance of the MOS OTA is proportional to the square-root of the effective driving current $I_{SS}$. Also, as seen from the equation (14a), the square term of $V_{IN}^2$ contained in the square-root can be cancelled by adding a current varying proportional to the square of the input voltage $V_{IN}$, i.e., $V_{IN}^2$. Thus, the transconductance can be linearized.

In the above first and second embodiments, the squarer 102 or 202 is made of two unbalanced bipolar or MOS transistor pairs. However, it is needless to say that the present invention is not limited hereto and any other squarer may be used. Some examples of the squarer were disclosed in the above U.S. Pat. No. 5,481,224.

Further, any other configuration than those shown here may be employed for the respective constant current sources 105, 106, 205 and 206 and the respective current mirror subcircuits 103, 104, 203 and 204.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An operational transconductance amplifier comprising:

(a) a first differential pair of first and second transistors whose emitters or sources are coupled together;

said coupled emitters of said first and second transistors being connected to a first constant current source supllying a first constant current;

bases or gates of said first and second transistors being applied with a differential input voltage;

an output current of said operational transconductance amplifier being derived from one of collectors or drains of said first and second transistors;

(b) a squarer producing differentially first and second output currents in response to said differential input voltage, said first output current increasing with said increasing input voltage, and said second output current decreasing with said increasing input voltage;

said squarer being connected to a second constant current source supplying a second constant current, and being driven by said second constant current;

said squarer having input ends across which said differential input voltage being applied and output ends through which said first and second output currents being derived; and said second output current being supplied to said first current source;

(c) wherein said differential pair being driven by a constant current that is equal to the difference of said first current from said second output current of said squarer.

2. An operational transconductance amplifier as claimed in claim 1, wherein said first and second transistors are bipolar transistors, respectively.

3. An operational transconductance amplifier as claimed in claim 1, wherein said first and second transistors are MOS field-effect transistors, respectively.

4. An operational transconductance amplifier as claimed in claim 1, wherein said squarer includes a second unbalanced differential pair of third and fourth transistors whose emitters or sources are coupled together and a third unbalanced differential pair of fifth and sixth transistors whose emitters or sources are coupled together;

and wherein said second differential pair is driven by a third constant current and said third differential pair is driven by a fourth constant current, the sum of said third and fourth constant currents being equal to said second constant current;

and wherein collectors or drains of said third and sixth transistors are coupled together, and collectors or drains of said fourth and fifth transistors are coupled together;

and wherein the driving capacity of said third transistor being K times as large as that of the fourth transistor, and the driving capacity of said sixth transistor being K times as large as that of said fifth transistor, where K is a constant greater than unity.

5. An operational transconductance amplifier as claimed in claim 1, wherein said input voltage is divided by resistive dividers and is then applied to said squarer.

* * * * *